United States Patent [19]

Johnson

[11] 4,297,521
[45] * Oct. 27, 1981

[54] FOCUSING COVER SOLAR ENERGY COLLECTOR APPARATUS

[76] Inventor: Steven A. Johnson, 136 N. 1st West, Preston, Id. 83263

[*] Notice: The portion of the term of this patent subsequent to May 26, 1998, has been disclaimed.

[21] Appl. No.: 970,762

[22] Filed: Dec. 18, 1978

[51] Int. Cl.³ .......................... H01L 31/04; F24J 3/02
[52] U.S. Cl. .................................... 136/248; 126/424; 126/438; 126/440; 126/450
[58] Field of Search ............... 126/424, 438, 440, 439, 126/441, 452, 425, 450; 136/89 PC, 248; 350/211

[56] References Cited

U.S. PATENT DOCUMENTS

| | | | |
|---|---|---|---|
| Re. 30,027 | 6/1979 | Hockman | 126/439 X |
| 811,274 | 1/1906 | Carter | 126/424 X |
| 1,345,758 | 7/1920 | Folsom | 126/424 |
| 3,052,229 | 9/1962 | Wenger | 126/424 |
| 3,915,147 | 10/1975 | Rineer | 126/446 X |
| 3,998,206 | 12/1976 | Jahn | 126/425 X |
| 4,011,857 | 3/1977 | Rice | 126/440 |
| 4,011,858 | 3/1977 | Hurkett | 126/424 |
| 4,027,653 | 6/1977 | Meckler | 126/438 X |
| 4,068,474 | 1/1978 | Dimitroff | 126/440 X |
| 4,069,812 | 1/1978 | O'Neill | 126/440 X |
| 4,077,392 | 3/1978 | Garner | 126/424 |
| 4,098,264 | 7/1978 | Brokaw | 126/438 X |
| 4,106,480 | 8/1978 | Lyon et al. | 126/438 X |
| 4,106,485 | 8/1978 | Polley | 126/425 |
| 4,108,154 | 8/1978 | Nelson | 126/425 |
| 4,108,540 | 8/1978 | Anderson et al. | 350/211 |
| 4,109,638 | 8/1978 | Matlock et al. | 126/425 |
| 4,116,221 | 9/1978 | Zaugg et al. | 126/424 |
| 4,129,119 | 12/1978 | Yoke | 126/424 |
| 4,139,286 | 2/1979 | Hein et al. | 126/438 X |
| 4,149,523 | 4/1979 | Boy-Marcotte et al. | 126/438 X |

FOREIGN PATENT DOCUMENTS

639277  3/1928  France ........................ 350/211

Primary Examiner—Allan N. Shoap
Attorney, Agent, or Firm—H. Ross Workman; J. Winslow Young; Allen R. Jensen

[57] ABSTRACT

A solar energy collector apparatus and method, the apparatus including an open-top shell structure configured with either an enclosed or lattice configuration and having a Fresnel lens system covering the open top of the shell structure. A mirror system and solar energy absorber apparatus are placed inside the shell structure. The shell structure is mounted upon a hollow axle for rotation about its longitudinal axis. The shell structure is also mounted for vertical movement of one end of the longitudinal axis to adapt the shell structure for following north-south changes in the sun's seasonal position. The hollow axle supports the solar energy absorber apparatus nonrotatably inside the shell structure and in fluid communication with insulated heat transfer conduits that pass nonrotatably through the hollow axle. A photovoltaic apparatus may be included in the shell structure for converting at least a portion of the solar flux to electrical energy while the heat transfer conduits supply any necessary cooling to the photovoltaic apparatus. This combination of features provides higher solar efficiencies and higher temperatures in the heat transfer fluid. The method includes tracking the sun with the solar energy collector apparatus thereby maximizing the amount of solar energy collected while eliminating twisting and thereby coupling failures in the heat transfer conduits.

20 Claims, 6 Drawing Figures

FOCUSING COVER SOLAR ENERGY COLLECTOR APPARATUS

BACKGROUND

1. Field of the Invention

This invention relates to solar energy collector apparatus and, more particularly, to a solar energy collector apparatus and method whereby focusing and reflecting apparatus for the solar collector is rotatably movable about a generally stationary solar energy absorber apparatus to improve collector efficiencies and also eliminate expensive and failure-prone rotatable couplings in the fluid heat transfer conduits.

This application contains patentably distinct subject matter from copending applications, Ser. No. 970,761 and Ser. No. 970,673, both filed on even date herewith.

2. The Prior Art

Currently, the only inexhaustable source of energy available to mankind is solar energy. Solar energy or solar flux is customarily measured in langleys per minute, one langley being equivalent to one calorie of radiation energy per square centimeter. The intensity of the solar flux varies with geographical location, time of day, season, cloud cover, atmospheric dust, and the like, and this intensity varies between about zero and 1.5 calories per square centimeter per minute. Therefore, assuming a solar flux of one langley per minute, one square meter receives 10,000 calories per minute while a house roof, having 100 square meters, receives about 1,000,000 calories per minute. With an average of one langley per minute for 500 minutes per day (which is slightly more than 8 hours), the 100 square meter roof receives, in bright sunshine, about 500,000 kilocalories per day. This energy is the equivalent in thermal energy to burning about 14 gallons of gasoline. Therefore, solar energy represents a valuable, inexhaustable energy resource.

When an object such as a solar collector is exposed to solar radiation, its temperature rises until its heat losses become equal to its heat gains. The losses depend on the emission of radiation by the heated material, movement of the surrounding colder air, and thermal conductivity of the materials in contact with it. The gains depend upon the intensity of solar radiation and the absorptivity of solar radiation by its absorption surface. Customarily, solar energy is collected by two general techniques to produce higher temperatures: (1) by covering a receiving surface with a sunlight-transparent sheet of glass or plastic (flat plate collector), and (2) by focusing the solar radiation from a large area onto a receiver of small area (focusing collectors).

Flat plate collectors are usually stationary but should be repositioned every few days to follow the seasonal variations in the solar track. Flat plate collectors have the advantage of being generally cheaper to fabricate and also have the advantage in absorbing heat from diffuse solar radiation as well as the direct radiation by being able to operate on cloudly but bright days.

Focusing collectors can produce much higher temperatures although they can use direct radiation only and require turning throughout the day to follow the sun. Although focusing collectors are useful in obtaining higher temperatures from solar energy, (1) they usually cost more, (2) they need to be moved continuously to track the sun, and (3) they can use only direct solar radiation that is unscattered by clouds or haze. One common form of focusing collector is a parabolic mirror which has been used to obtain temperatures up to about 3500° C. depending upon the optical perfection of the parabolic surface. Unfortunately, parabolic collectors are relatively expensive, require sophisticated mountings and the absorption surface is usually interposed between the sun and the parabolic reflector at a position adjacent the focal point of the parabolic curvature.

Another device for useful focusing solar energy in a focusing collector is the Fresnel lens. The Fresnel lens consists of nested grooves cut or otherwise formed in one face of a transparent material such as plastic. The sides of each successive groove is set in such a way that the light passing through each groove is refracted at a slightly different angle so as to converge on a common focal point or line. Such lenses have been pressed from rigid sheets of plastic material and are, therefore, relatively inexpensive while being effective to give a relatively sharp focus. A more detailed discussion on the use of a Fresnel lens in a solar concentrator can be found in "Large-Scale Fresnel Lens Solar Concentrator" Marshall Space Flight Center, Alabama; *NASA Tech Briefs*; Winter (1977) p. 461.

Since focusing collectors require tracking mechanism for tracking the sun, various types of tracking devices have been developed. Tracking of the sun in its east-west movement only is relatively simple since the sun moves at a rate of 15° of arc every hour. This calculation is determined on the basis of the earth making one complete revolution of 360° in a 24 hour period so that in one hour it moves 360° divided by 24 or 15°. However, the annual motion of the earth relative to the sun causes the sun to appear to move in declination by about 47°. This wide range from summer solstice to winter solstice is a major problem any focusing collector system must face. Thus, any fully tracking collector that is focused continuously on the position of the sun in the sky requires motion in two coordinates. While the exact coordinates in which the motion is made are not deemed important, one set of coordinates may be rendered redundant by using an equatorial mounting where one axis of rotation is supported parallel to the axis of rotation of the earth. The sun then appears to have no significant daily motion in the transverse coordinate (declination). Meanwhile, any other set of axes of motion requires two motions to track the daily motion of the sun. However, in order to accommodate seasonal variations, it is necessary to include within the equitorial mounting a mechanism for matching daily changes in the seasonal position of the sun. Thus, an equatorial mounting presents the more feasible mounting system for a tracking or focusing solar collector.

Additional information regarding solar collectors can be found in APPLIED SOLAR ENERGY, Aden B. Meinel and Marjorie P. Meinel, Addison-Wesley Publishing Company, Reading, Mass. (1976) Library of Congress Catalog Card No. 75-40904, and DIRECT USE OF THE SUN'S ENERGY, Farrington Daniels, Ballantine Books, N.Y. (1977) Library of Congress Catalog Card No. 64-20913.

Utilization of collected solar energy very often occurs at a location other than the center of focus for a focusing collector. The exception to this statement are those focusing collectors which are used primarily as photovoltaic power towers, solar cookers, etc. The technique for transferring solar energy from its collection site to its utilization site generally involves some form of fluid heat transfer medium. The fluid heat transfer medium is conducted through conduits to and from the solar energy absorption site. The heat transfer medium is heated by the thermal energy produced by the absorbed solar energy and carries the thermal energy to the utilization site where the thermal energy is either utilized directly or stored for subsequent use. Unfortunately, the combination of movable solar collectors and fluid heat transfer conduits presents difficulties with regard to fabricating solar collectors which will accommodate flexure or otherwise movement of the fluid heat transfer conduits.

In view of the foregoing, it would be an advantage in the art to provide improvements in solar collector apparatus and the method for collecting solar energy. It would also be an advancement in the art to provide a solar collector apparatus for tracking the sun, the apparatus including mechanism for accommodating the movement of the solar collector while minimizing excessive flexure or twisting of the fluid heat transfer conduits. Such an invention is disclosed and claimed herein.

BRIEF SUMMARY AND OBJECTS OF THE INVENTION

The present invention relates to a novel apparatus and method for focusing and collecting solar energy. The solar energy may be absorbed as thermal energy by a fluid heat transfer medium or may be converted to electrical energy by conventional photovoltaic apparatus. The solar energy collector apparatus is configurated to be a focusing collector and includes a supporting shell structure to accommodate tracking the daily and seasonal movement of the sun. Mirrors reflect the focused solar flux toward a solar energy apparatus. Excessive flexure or twisting of fluid heat transfer conduits is minimized by mounting the solar energy apparatus in a generally stationary position inside a movable shell structure. Portions of the solar flux can be converted to electrical energy with photovoltaic apparatus in the shell structure.

It is, therefore, a primary object of this invention to provide improvements in solar energy collector apparatus.

Another object of this invention is to provide an improved method for collecting solar energy.

Another object of this invention is to provide a focusing solar collector apparatus which is relatively inexpensive to fabricate.

Another object of this invention is to provide a solar collector apparatus wherein the fluid heat transfer conduits are maintained in a relatively stationary position to minimize flexure of the conduits.

Another object of this invention is to provide a solar collector apparatus wherein the solar energy absorber mechanism is relatively stationary while the collector apparatus rotates thereabout.

These and other objects and features of the present invention will become more fully apparent from the following description and appended claims taken in conjunction with the accompanying drawing.

DETAILED DESCRIPTION OF THE PREFERRED EMBODIMENTS

Figure 1:
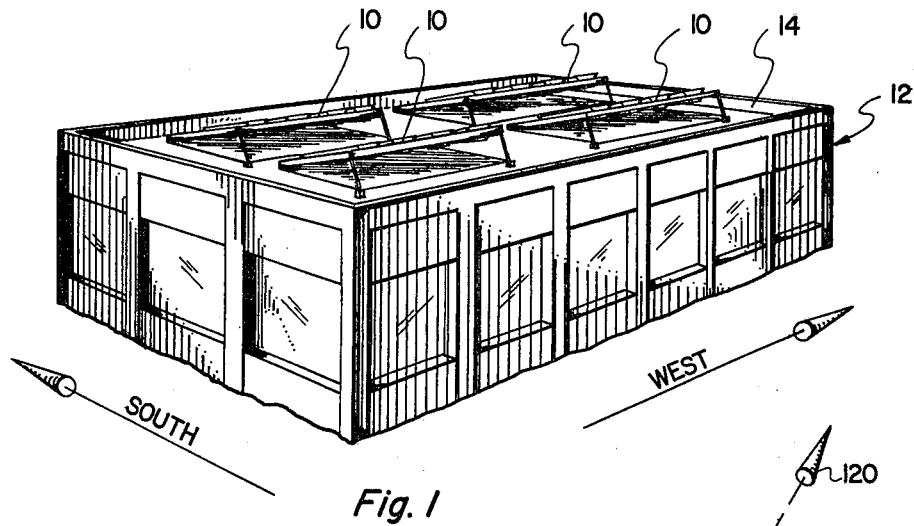
FIG. 1 is a perspective view of a plurality of solar collector apparatus shown in the environment of a building.

The invention is best understood by reference to the drawing wherein like parts are designated with like numerals throughout.

The Embodiment of FIGS. 1-4

Referring now more particularly to FIG. 1, the solar collector apparatus of this invention is shown generally as a plurality of banked solar collectors 10 on a roof 14 of a building 12. Banked solar collectors 10 may be selectively interconnected to provide the required absorption of solar energy in the form of thermal energy for use in building 12. It should be noted that solar collector apparatus 10 is mounted on building 12 with building 12 oriented in a north-south direction and, therefore, in position for collecting solar energy in a northern latitude. Conversely, if banked solar collectors 10 were slanted toward the north, they would be in position for collecting solar energy in a southern latitude. With banked solar collectors 10 suitably oriented for the Northern Hemisphere (with arrows indicating the directions west and south) solar collectors 10 are set to track the sun in its east-west traversal as well as following the seasonal changes in the position of the sun or declination as will be discussed more fully hereinafter.

Figure 2:
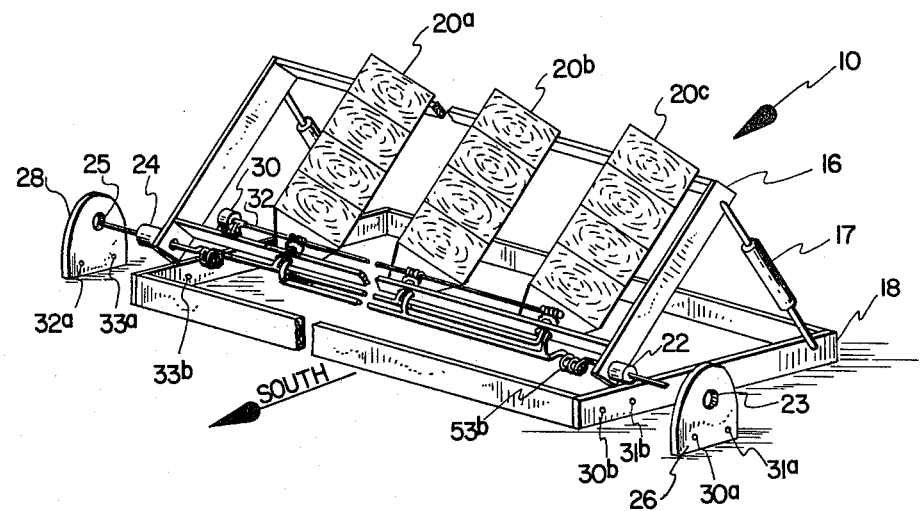
FIG. 2 is a partially exploded perspective view of a first preferred embodiment of one of the solar collector apparatus of FIG. 1.

Referring now more particularly to FIG. 2, a banked solar collector 10 is shown in more detail and includes a plurality of solar collectors 20a–20c. The support structure for solar collectors 20a–20c includes a frame 16 pivotally supported on a base 18 by pivot arms 22 and 24 and lift assembly 17. Pivot arms 22 and 24 are hollow and are rotatably mounted in apertures 23 and 25, respectively, of end supports 26 and 28, respectively. End supports 26 and 28 are adapted to be bolted to base 18 by passing bolts (not shown) through the respective bolt apertures therein. For example, end support 26 includes bolt apertures 30a and 31a which mate with bolt apertures 30b and 31b, respectively, in base 18. Corresponding bolt apertures 32a and 33a in end support 28 selectively secure end support 28 to base 18 through corresponding bolt apertures in base 18, only one of which is shown herein as bolt aperture 33b.

Vertical movement of lift assembly 17 moves frame 16 to a position perpendicular to the apparent plane of travel for the sun during both its relatively large seasonal variations and also any small daily variations. For example, during the summer months in the northern latitude, the longitudinal extension of lift assembly 17 is substantially decreased thereby decreasing the angular difference between frame 16 and base 18. Correspondingly, during winter months lift assembly 17 is extended so as to raise frame 16 to thereby compensate for the lower angle of the sun. The daily north-south variations in the lift height are zero at each of the Spring equinox and the autumn equinox but may be fairly substantial in winter and especially so in summer. Some of this vertical movement of lift assembly 17 can be reduced by orienting the sides of base 18 parallel to the axis of rotation of the earth. This would be accomplished by raising the rear edge of base 18 the appropriate number of degrees depending upon the northern latitude at which solar collector apparatus is placed. In this manner, the plane of base 18 would be parallel to the axis of earth rotation so that the mounting of solar collector apparatus 10 would function similarly to an equitorial mounting.

Lift assembly 17 may be any suitable device including, for example, hydraulic actuators, linear electrical motors, and mechanical devices such as jacks and the like. Clearly, some form of automated jacks are preferred since daily adjustment of lift assembly 17 may be necessary for adapting banked solar collector 10 for optimal daily north-south orientation to any variations in the position of the sun.

Figure 3:
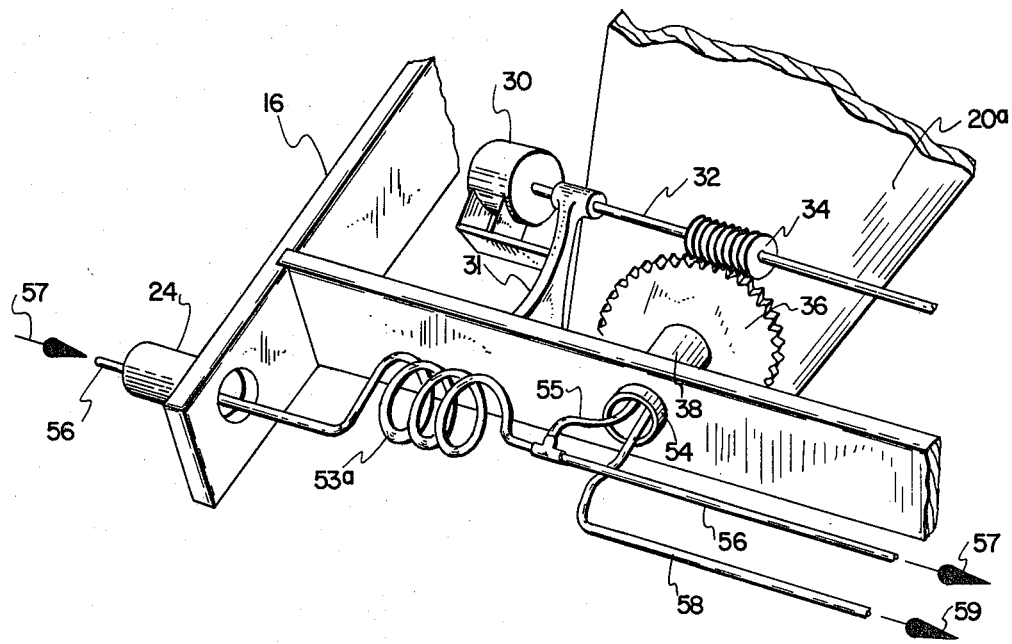
FIG. 3 is an enlarged, partial perspective view of the solar collector apparatus of FIG. 2 with portions broken away for ease of illustration.
Figure 4:
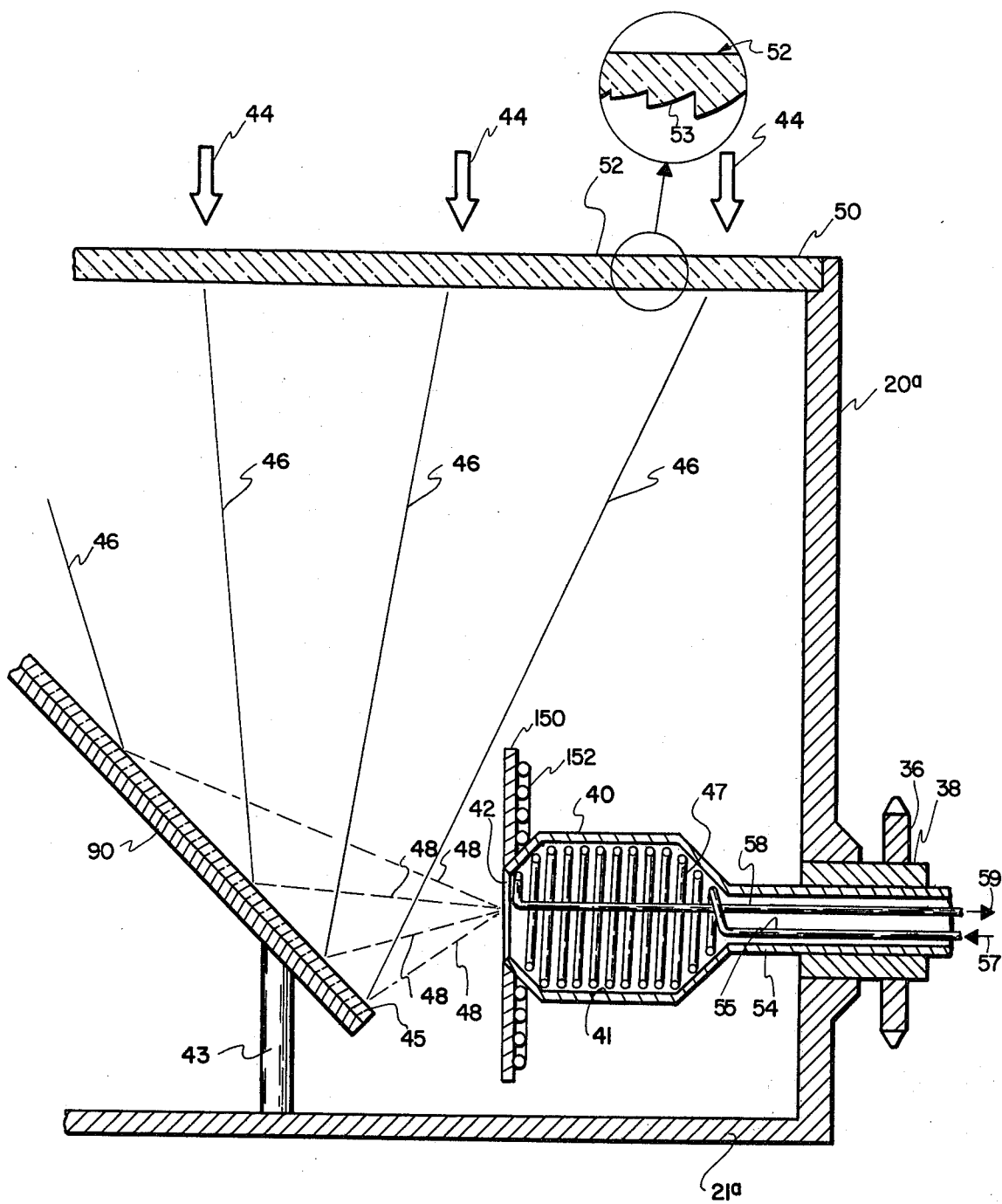
FIG. 4 is an enlarged, fragmentary cross section of a portion of the first presently preferred embodiment of a solar collector apparatus of FIGS. 1, 2 and 3.

Referring now more particularly to FIG. 3, the support for the daily east-west tracking mechanism for solar collectors 20a–20c (FIG. 2) of this invention is shown more clearly with an enlargement of a portion of solar collector 20a of FIG. 2. In particular, solar collector 20a is supported in frame 16 by a fixed, hollow axle 54 over which a sleeve 38 rotatably slides. Hollow axle 54 extends interiorly of solar collector 20a and supports a solar energy absorber apparatus such as holorum 40 (FIG. 4) the function of which will be discussed more fully hereinafter. Hollow axle 54 is stationary relative to frame 16 and thereby provides a non-rotatable entry for conduits 55 and 58 to pass into holorum 40 (FIG. 4).

Sleeve 38 functions as a bearing for rotatably mounting solar collector 20a to frame 16. A gear 36 is mounted to sleeve 38 and is engaged by a worm gear 34 mounted on a shaft 32. Shaft 32 extends from a motor 30 and is selectively rotated to provide the daily rotational movement of solar collector 20a about hollow axle 54 to accommodate the daily tracking of the east-west movement of the sun. Motor 30 is mounted on a stanchion 31 and may be selectively ganged with other banked solar panels 10 (FIG. 1) through the appropriate shafts, universal joints, bearings, gears and couplings (not shown). Alternatively, motor 30 could be mounted on roof 14 (FIG. 1) and selectively interconnected to shaft 32 by any suitably mechanism or linkage including, for example, belts, gear trains, and the like (not shown). Importantly, however, motor 30 and, more particularly, shaft 32 is selectively turned to provide ganged tracking for the necessary daily tracking of the sun by solar collectors 20a–20c (FIG. 2) in each of banked solar collectors 10 (FIG. 1).

Tracking control, for example, of each of motor 30 and lift assembly 17 (FIGS. 2 and 3) and motors 130 and 140 (FIG. 6) is easily accomplished with any suitable conventional control such as balancing solar cells to locate the sun and produce a signal to the respective motors and thereby control movement of the various motors and lift assemblies.

A suitable heat transfer medium such as water, or the like, is directed into an inlet header 56 as shown schematically by flow arrow 57 where a portion thereof is diverted through an inlet tube 55 into holorum 40 (FIG. 4) and removed therefrom as a hot fluid stream 59 through an outlet tube formed as a first end of an outlet header 58. A coil 53a is interposed in inlet header 56 to accommodate flexure and twisting of header 56 upon rotation of frame 16 about hollow support arm 24. Coil 53a insures that the elastic limit of the material of construction of inlet header 56 is not exceeded by movement of frame 16 by lift assembly 17 (FIG. 2). In this manner, the left end of inlet header 56 extending through hollow support arm 24 remains relatively stationary while the remainder of inlet header 56 may be twisted relative thereto upon movement of frame 16. The remainder of solar collectors 20b and 20c (FIG. 2) are also suitably interconnected with inlet header 56 and outlet header 58 to provide the appropriate heating of the heat transfer fluid 57 as shown by heated fluid 59. Outlet header 58 includes a second coil 53b (FIG. 2) to accommodate the rotational movement between frame 16 and the exterior conduit of outlet header 58 extending beyond the periphery of frame 16.

Referring now more particularly to FIG. 4, solar collector 20a is shown in further detail more particularly illustrating the internal configuration thereof. Solar collector 20a consists of an outer shell 21a forming a box-like enclosure having a transparent cover 50. Transparent cover 50 is configured with a plurality of Fresnel lenses 52 therein. With particular reference to the enlargement of FIG. 4, Fresnel lens 52 is shown schematically with lenslets 53 combining to form Fresnel lens 52. Fresnel lenses 52 are circular in this first preferred embodiment and focus incident solar flux 44 as concentrated solar flux 46 on a mirror 45. Mirror 45 is mounted to shell 21a through a support 43 and is adapted to reflect concentrated solar flux 46 as reflected solar flux 48 to a focal point at an entrance 42 of holorum 40 and generally corresponding to the axis of hollow axle 54. In this manner, a relatively large surface area, as represented by Fresnel lens 52, is exposed to solar radiation so that incident solar radiation is concentrated and reflected by mirror 45 into holorum 40. It should be noted that mirror 45 is mounted in such a manner that the reflected solar flux 48 coincides generally with the axis of rotation of shell 21a about axle 54. In this manner, solar collector 20a can be selectively pivoted about axle 54 by movement of gear 36 during the daily east-west tracking of the sun by solar collector 20a without requiring rotation of holorum 40.

Holorum 40 is shown inside solar collector 20a and as being coextensive with hollow axle 54. It should be noted that holorum 40 is nonrotatably supported relative to frame 16 (FIGS. 2 and 3) by hollow axle 54. Holorum 40 is configured as an enlarged cylindrical member having reduced-diameter ends with an opening 42 in one end to permit the passage of focused solar flux into the interior or cavity 41 thereof. Since cavity 41 is relatively enlarged as compared to opening 42, a substantial portion of the concentrated solar flux 48 is restrained in cavity 41 with little opportunity to escape through opening 42 thereby converting a portion of the reflected solar flux 48 into thermal energy. Cavity 41 includes a coil 47 formed in the tubing between inlet tubing 55 and outlet tubing 58. Coil 47 is selectively coated with a suitable absorbent material such as a nonreflective black coating to accommodate the absorption of solar energy.

While holorum 40 is shown mounted to hollow axle 54 at one end of solar collector 20a, corresponding features may also be found at the opposite end of shell 21a. However, the illustrated embodiment of FIG. 4 may be fabricated with only one holorum 40 therein as shown for ease of fabrication. In either event, solar collector 20a is fabricated so as to minimize twisting and flexure of the heat transfer conduits between holorum 40 and a distant utilization and/or storage site (not shown).

A flat plate collector 150 having additional heat transfer coils 152 thereon is formed as a circular annulus surrounding opening 42. Coils 152 may be interposed in the fluid stream of coils 47 or, preferably may serve as a preheater for inlet stream 57 before passing through coils 47. Flat plate collector 150 serves as a collector for scattered solar flux reflected from mirror 45 and may include any of the techniques known in the art for improved performance such as the use of transparent cover plates or selective surfaces. It shall be understood also that the flat plate collector may be replaced or supplemented by a Winston Collector which is configurated as a portion of a displaced and truncated paraboloid of revolution and is well known in the art. The Winston Collector may be attached to holorum 40 such that their resective apertures and longitudinal axis are coincident. Flat plate collector would then be attached to the outer lip of the Winston Collector.

A photovoltaic surface 90 is mounted to the rear face of mirror 45 and is operable to convert a portion of concentrated solar flux 46 into electrical energy. To this end, mirror 45 may be fabricated as a selective reflective surface to allow an appropriate portion of the solar spectrum in concentrated solar flux 46 to reach photovoltaic surface 90. Alternatively, flat plate collector 150 may be fabricated as a photovoltaic surface with coils 152 providing appropriate cooling while simultaneously acting as a preheater for stream 57.

Furthermore, holorum 40 may be fabricated with a beam splitter-type device (not shown) have a selective surface thereon for reflecting a predetermined portion of the solar spectrum toward a first photovoltaic apparatus (not shown) having a higher efficiency with that particular spectral range and transmitting the remainder of the solar spectrum toward a second photovoltaic apparatus (not shown) having a hgher efficiency with that particular spectral range. This is conventional apparatus and is, therefore, not specifically illustrated herein. Coils 47 would be suitably reconfigured to provide any required cooling for the subject photovoltaic apparatus.

The electrical energy produced by the photovoltaic apparatus may be used to actuate the necessary tracking device (not shown) required to constantly orienting the apparatus of this invention toward the sun or for other uses. No particular tracking or sun sensing devices are shown herein since such devices are known in the art and may be obtained from commercial sources.

Advantageously, the apparatus and method of this invention is relatively inexpensive to fabricate and to operate. For example, shell 21a may be suitably fabricated from any inexpensive material such as plastic, plywood or the like while transparent cover 50 and, more particularly, Fresnel lenses 52 therein may be suitably pressed from any appropriate, sufficiently rigid and clear plastic material. Swivel couplings or other similar devices to accommodate the twisting of fluid conduits are eliminated by pivotally mounting shell 21a over hollow axles 54. A plurality of solar collectors 20 may be suitably mounted in frame 16 (FIG. 2) with each solar collector 20 selectively interconnected for rotation about their resective axis. Several sets of banked solar collectors 10 may be suitably ganged to provide increased quantities of heated fluid.

In all instances throughout the description of this invention, it is expressly understood that the shell-like structure of the various solar collector apparatus herein may be fabricated with either an open top, box-like configuration or with an open, lattice configuration. Although the box-like enclosure may be preferable for many applications since it would provide a degree of shielding against convective and conductive heat losses, an open, lattice-like structure would also provide a less expensive structure and one that would be less susceptible to wind damage. Additionally, where desirable, the various structures may be suitably enclosed in a greenhouse-like structure (not shown) as is well known in the art.

It should be clearly understood throughout the description of this invention that suitable insulation at any appropriate location such as around the various conduits, solar energy absorber apparatus, etc., will provide improved efficiencies as is well known in the art. However, for sake of simplicity in understanding the novel features of this invention, all such insulation was purposely excluded from the drawing.

Figure 5:
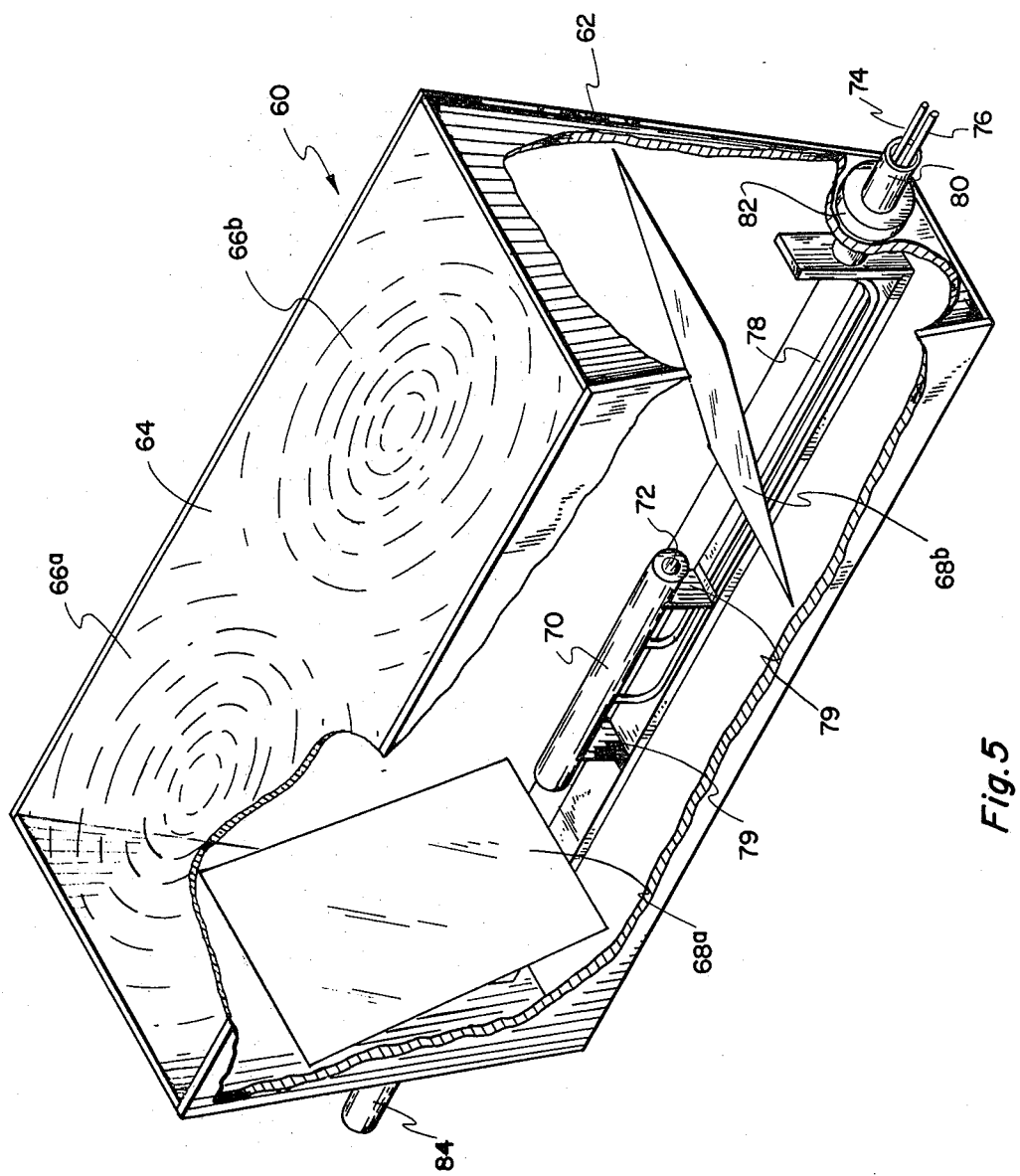
FIG. 5 is a perspective view of a second preferred embodiment of the solar collector apparatus of this invention with portions broken away for ease of illustration.

The Embodiment of FIG. 5

Referring now more particularly to FIG. 5, a second preferred embodiment of the solar collector apparatus of this invention is shown herein as a solar collector 60 fabricated from a hollow shell 62 and enclosed with a transparent cover 64 having a plurality of Fresnel lenses 66a and 66b formed therein. Shell 62 is adapted for pivotal movement about hollow support axle 80 and support axle 84. A gear 82 (shown schematically herein for ease of illustration) adapts shell 62 for rotation of about axles 80 and 84 by engagement with a worm gear (not shown) such as worm gear 34 (FIG. 3).

A bridge 78 extends between axles 80 and 84 and is spaced from shell 62. Bridge 78 serves as a support for a stand 79 for a holorum 70. Bridge 78 thereby allows holorum 70 to remain stationary during rotation of shell 62 thereabout. Holorum 70 is schematically illustrated and may be configured similar to holorum 40 (FIG. 4) and is interconnected with a heat transfer fluid medium through conduits 74 and 76. Holorum 70 functions similarly to holorum 40 (FIG. 4) with the exception that the solar flux is focused in each end of holorum 70 through apertures such as shown by aperture 72.

Mirrors 68a and 68b are mounted to shell 62 in such a position to reflect focused solar flux from Fresnel lenses 66a and 66b, respectively, into the respective ends of holorum 70. It should be noted that holorum 70 is mounted on the axis represented by axles 80 and 84 so that rotation of mirrors 68a and 68b by rotation of shell 62 will not affect the center of focus relative to holorum 70. Accordingly, holorum 70 remains relatively stationary while shell 62 rotates thereabout and mirrors 68a and 68b provide the necessary optical coupling for the focused solar flux.

In operation, solar collector 60 is suitably mounted in a frame such as frame 16 (FIGS. 2–4) for pivotal rotation about an axis represented by axles 80 and 84. The supporting frame (not shown) such as frame 16 (FIGS. 2 and 3) is mounted for movement to follow the seasonal variations of the sun. Upon exposure to incident solar radiation perpendicular to the plane of transparent panel 64, Fresnel lenses 66a and 66b selectively focus the solar flux on mirrors 68a and 68b, respectively. Thereafter, the solar flux is reflected into each end of holorum 70 where the solar flux is absorbed and becomes thermal energy which can be recovered as set forth hereinbefore. Advantageously, shell 62 encloses the apparatus of the mirror and holorum to shield the same against conductive and convective heat losses to the ambient thereby increasing the thermodynamic efficiency of the unit. Additionally, shell 62 may be suitably insulated against heat losses.

Figure 6:
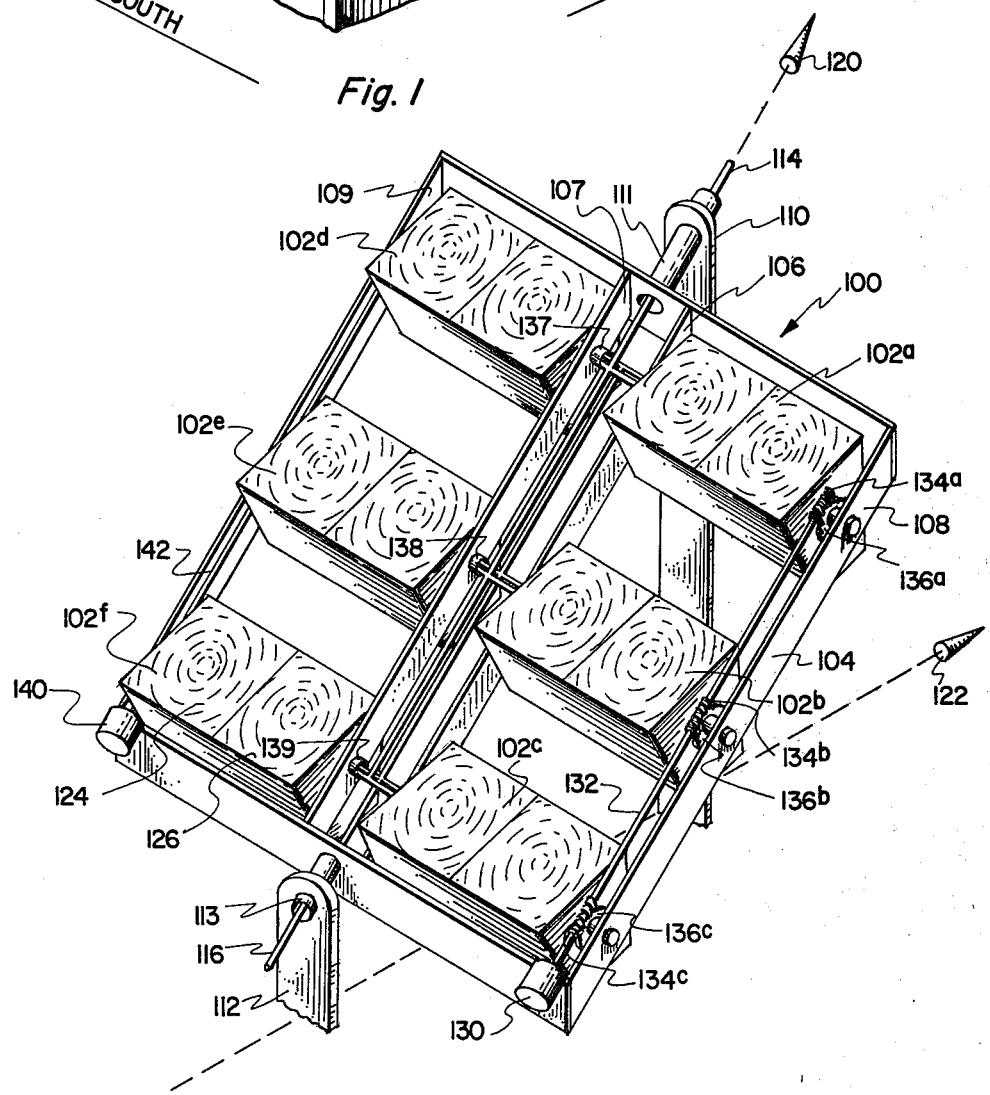
FIG. 6 is a perspective view of an alternate mounting arrangement for the solar collector apparatus of this invention.

Referring now more particularly to FIG. 6, a third preferred solar collector apparatus of this invention is shown as solar collector apparatus 100 and includes a plurality of solar collectors 102a–102f mounted in a frame 104. Frame 104 is pivotally mounted in upright supports 110 and 112 by means of rotatable, hollow axles 111 and 113, respectively. Axles 111 and 113 are hollow to provide passageways for conduits 114 and 116, respectively. Conduits 114 and 116 provide the appropriate inlet and outlet headers for heat transfer fluid through each of the solar energy absorber apparatus (not shown) in solar collectors 102a–102f.

Vertical supports 110 and 112 are oriented in a north-south direction with arrow 122 indicating the appropriate direction. For example, for placement in the northern latitudes, arrow 122 represents geographic north whereas in the southern latitudes, arrow 122 would represent geographic south. The axis between hollow support axles 111 and 113 as illustrated by arrow 120 is oriented to correspond with the axis of rotation of the earth. For example, if arrow 122 points to the geographic north then arrow 120 is parallel to the axis of rotation of the earth and points toward the North Star. In this manner, an equatorial mounting is supplied for frame 104 so that frame 104 may be rotated about the axis represented by arrow 120 to track the sun in its east-west movement.

Solar collectors 102a–102c are supported between side members 106 and 108 of frame 104 while solar collectors 102d–102f are supported between side members 107 and 109. Each of solar collectors 102a–102f are pivotally supported between the respective side members by hollow axles such as hollow axles 137–139 mounted in side member 107. Corresponding hollow axles (not shown) provide mounting for solar collectors 102a–102c in side member 106. Pivotal rotation of solar collectors 102a–102c is provided by gears 136a–136c, respectively, which are engaged by worm gears 134a–134c, respectively, mounted on shaft 132. Shaft 132 is rotated by motor 130 to thereby selectively orient each of solar collectors 102a–102c toward the sun. Corresponding features are found for each of solar collectors 102d–102f with motor 140 turning shaft 142 to provide the appropriate rotation thereof. Rotational movement of each of solar collectors 102a–102c by movement of rotation of shaft 132 and, correspondingly, rotation of solar collectors 102d–102f by rotation of shaft 142 thereby accommodates the direct tracking of the sun during its seasonal variations as well as minor daily variations of movement.

It should be particularly noted with respect to the configuration of solar collector apparatus 100 that the various heat transfer fluid conduits therein are relatively stationary with respect to movement of solar collectors 102a–102f. If desired, coils such as coil 53a (FIG. 3) and coil 53b (FIG. 2) may be provided for each of conduits 114 and 116 to accommodate the appropriate flexure necessary for the twisting of frame 104 about the axis represented by arrow 120. In this manner, flexible joints, couplings and the like are effectively eliminated thereby substantially improving the simplicity and relative inexpensive construction of the apparatus of this invention.

It should be noted also that the solar collector apparatus illustrated in all of FIGS. 1–6 may be suitably spaced one from another to preclude shadowing of the adjacent solar collector apparatus particularly at low angles of incident solar radiation such as experienced in the early morning and late evening hours as well as mid-winter and mid-summer. Furthermore, the various collector shells may be configured with a semicylindrical exterior contour to remove unnecessary bottom corners which would otherwise interfere with or cause shadowing of adjacent units.

The invention may be embodied in other specific forms without departing from its spirit or essential characteristics. The described embodiments are to be considered in all respects only as illustrative and not restrictive and the scope of the invention is, therefore, indicated by the appended claims rather than by the foregoing description. All changes that come within the meaning and range of equivalency of the claims are to be embraced within their scope.

What is claimed and desired to be secured by a United States Letters Patent is:

1. A solar collector comprising:
   a shell structure, the shell structure having an open top;
   first mounting means for the shell structure;
   solar energy absorber means inside the shell structure;
   second mounting means for the shell structure and supporting the solar energy absorber means coaxially inside the shell structure in a nonrotatable position relative to the sun to thereby accomodate rotational movement of the shell about the solar energy absorber means to accomodate rotating the shell structure about an axis of the second mounting means to orient the open top of the shell structure toward the sun, the second mounting means comprising a first hollow shaft and a second shaft, the shell structure being rotatably mounted on the first hollow shaft and the second shaft, the second mounting means further comprising a bridge structure extending between and substantially aligned with the first hollow shaft and the second shaft, the bridge structure supporting the solar energy absorber means; and
   optical means in the shell structure for directing solar energy toward the solar energy absorber means, said optical means comprising a Fresnel lens means for focusing solar flux and mirror means for reflecting the focused solar flux toward the solar energy absorber means, said Fresnel lens means comprising a transparent cover over the open top of the shell structure.

2. The solar collector defined in claim 1 wherein the first mounting means comprises a framework with the shell structure rotatably mounted on the second mounting means in the framework.

3. The solar collector defined in claim 2 wherein the first mounting means further comprises a base with the framework movably mounted to the base to accommodate orienting the open top of the shell structure toward the sun.

4. The solar collector defined in claim 1 wherein the solar energy absorber means includes photovoltaic means for converting at least a portion of the solar energy to electrical energy.

5. The solar collector defined in claim 1 wherein the solar energy absorber means includes conduit means for conducting a fluid heat transfer medium to and from the solar energy absorber means, the conduit means passing through the second mounting means thereby avoiding rotation of the conduit means when the shell structure is rotated upon the first mounting means.

6. The solar collector defined in claim 1 wherein the solar energy absorber means comprises a holorum.

7. The solar collector defined in claim 1 wherein the second mounting means comprises at least a first hollow shaft on at least one end of the shell structure, the hollow shaft serving as a passageway for said conduit means in rotatable relation to the shell structure and nonrotatable relation to said framework.

8. A solar collector apparatus comprising:
 a framework;
 a plurality of solar collectors;
 first mounting means for rotatably mounting the solar collectors in the framework;
 solar energy absorber means in each of the solar collectors;
 second mounting means for mounting the solar energy absorber means coaxially in each of the solar collectors and nonrotatably relative to the framework,
 the second mounting means comprising a first hollow shaft and a second shaft on each solar collector, each solar collector being rotatably mounted on its respective first hollow shaft and its second shaft, the second mounting means further comprising a bridge structure in each solar collector extending between and substantially aligned with its respective first hollow shaft and its second shaft, the budge structure supporting the solar energy absorber means;
 conduit means for transporting a fluid heat transfer medium through the solar energy absorber means, the conduit means passing through the hollow axle of the second mounting means and thereby being in nonrotatable relationship with the framework; and
 optical means for directing solar energy toward the solar energy absorber means, said optical means comprising a Fresnel lens means configured as a cover for each of the solar collectors and a mirror means inside each solar collector to reflect solar energy coaxially toward said solar energy absorber means.

9. The solar collector apparatus defined in claim 8 wherein the first mounting means further comprises rotating means for rotating the solar collectors in the framework.

10. The solar collector apparatus defined in claim 9 wherein the rotating means comprises gear means comprising a gear on each solar collector and also comprising a rotatable shaft with a plurality of worm gears on the shaft, the worm gears engaging the gear on each solar collector so that rotation of the shaft imparts rotation to the solar collectors.

11. A solar collector comprising:
 a shell structure, the shell structure having an open top;
 a transparent cover for the open top of the shell structure, the transparent cover comprising Fresnel lens means for focusing solar flux;
 first mounting means for the shell structure for rotating the shell structure about an axis to orient the open top of the shell structure toward the sun;
 solar energy absorber means inside the shell structure comprising a holorum, the holorum means including a flat plate solar energy collector formed as an annulus about the periphery of the opening to the holorum;
 second mounting means for supporting the solar energy absorber means coaxially inside the shell structure in a nonrotatable position relative to the sun to thereby accomodate rotational movement of the shell structure about the solar energy absorber means; and
 reflecting means in the shell structure for reflecting focused solar flux coaxially toward the solar energy absorber means.

12. The solar collector defined in claim 11 wherein the first mounting means comprises a framework with the shell structure rotatably mounted to the framework.

13. The solar collector defined in claim 12 wherein the framework further comprises means for orienting the framework in an orientation generally parallel to the axis of rotation of the earth with the Fresnel lenses normal to the sun.

14. The solar collector defined in claim 12 wherein the first mounting means further comprises a base for supporting the framework, the base being oriented in a north-south direction to accommodate orienting the top of the shell structure toward the sun.

15. The solar collector defined in claim 11 wherein the reflecting means includes photovoltaic means for converting at least a portion of the solar spectrum to electrical energy.

16. The solar collector defined in claim 11 wherein the solar energy absorber means includes conduit means for conducting a fluid heat transfer medium to and from the solar energy absorber means, the conduit means passing through the second mounting means thereby avoiding rotation of the conduit means when the shell structure is rotated upon the first mounting means.

17. The solar collector defined in claim 11 wherein the second mounting means comprises a first hollow shaft on at least one end of the shell structure, the hollow shaft serving as a passageway for said conduit means in rotatable relation to the shell structure and nonrotatable relation to said framework.

18. A solar collector comprising:
 a shell structure, the shell structure having an open top;
 a transparent cover for the open top of the shell structure, the transparent cover comprising Fresnel lens means for focusing solar flux;
 first mounting means for the shell structure for rotating the shell structure about an axis to orient the open top of the shell structure toward the sun;
 solar energy absorber means inside the shell structure;
 second mounting means for supporting the solar energy absorber means coaxially inside the shell structure in a nonrotatable position relative to the sun to thereby accomodate rotational movement of the shell structure about the solar energy absorber means, the second mounting means comprising a first hollow shaft and a second shaft, the shell structure being rotatably mounted on the first hollow shaft and the second shaft, the second mounting means further comprising a bridge structure extending between and substantially aligned with the first hollow shaft and the second shaft, the bridge structure supporting the solar energy absorber means; and reflecting means in the shell structure for reflecting focused solar flux coaxially toward the solar energy absorber means.

19. The solar collector apparatus defined in claim 18 wherein the first mounting means further comprises rotating means for rotating the solar collectors in the framework.

20. The solar collector apparatus defined in claim 19 wherein the rotating means comprises gear means comprising a gear on each solar collector and also comprising a rotatable shaft with a plurality of worm gears on the shaft, each of the worm gears selectively engaging the gear on each solar collector so that rotation of the shaft imparts rotation to the solar collectors.

* * * * *

UNITED STATES PATENT AND TRADEMARK OFFICE
CERTIFICATE OF CORRECTION

PATENT NO. : 4,297,521
DATED : October 27, 1981
INVENTOR(S) : Steven A. Johnson

It is certified that error appears in the above-identified patent and that said Letters Patent are hereby corrected as shown below:

Column 1, line 59, "cloudly" should be --cloudy--
Column 5, line 52, "suitably" should be --suitable--
Column 7, line 24, "resective" should be --respective--
Column 7, line 44, "hgher" should be --higher--
Column 7, line 67, "axles" should be --axle--
Column 8, line 2, "resective" should be --respective--
Column 11, line 40, "budge" should be --bridge--

Signed and Sealed this

Sixteenth Day of February 1982

[SEAL]

Attest:

GERALD J. MOSSINGHOFF

Attesting Officer   Commissioner of Patents and Trademarks